United States Patent
Chang et al.

(10) Patent No.: US 11,342,179 B2
(45) Date of Patent: May 24, 2022

(54) SEMICONDUCTOR STRUCTURE HAVING A SI SUBSTRATE HETEROINTEGRATED WITH GAN AND METHOD FOR FABRICATING THE SAME

(71) Applicant: NATIONAL CHIAO TUNG UNIVERSITY, Hsinchu (TW)

(72) Inventors: Edward Yi Chang, Hsinchu County (TW); Chieh-Hsi Chuang, Hsinchu (TW); Jessie Lin, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 65 days.

(21) Appl. No.: 17/116,585

(22) Filed: Dec. 9, 2020

(65) Prior Publication Data
US 2021/0118670 A1  Apr. 22, 2021

Related U.S. Application Data
(62) Division of application No. 16/519,418, filed on Jul. 23, 2019, now abandoned.

(30) Foreign Application Priority Data
May 21, 2019 (TW) ................. 108117447

(51) Int. Cl.
*H01L 21/02* (2006.01)
*H01L 29/20* (2006.01)

(52) U.S. Cl.
CPC ...... *H01L 21/0254* (2013.01); *H01L 21/0262* (2013.01); *H01L 21/02381* (2013.01);
(Continued)

(58) Field of Classification Search
CPC .......... H01L 29/2003; H01L 29/205; H01L 21/0254; H01L 21/02433; H01L 21/02458
See application file for complete search history.

(56) References Cited

U.S. PATENT DOCUMENTS 6,245,144 B1  6/2001  Bitner et al.
6,635,901 B2  10/2003 Sawaki et al.
(Continued)

FOREIGN PATENT DOCUMENTS

CN  101300663 A  11/2008
CN  102024768 A   4/2011
(Continued)

OTHER PUBLICATIONS

Examination Report dated Nov. 26, 2020 for corresponding CN Application No. 201910456914.1.
(Continued)

*Primary Examiner* — Phat X Cao
(74) *Attorney, Agent, or Firm* — Rosenberg, Klein & Lee

(57) ABSTRACT

A semiconductor structure having a Si substrate heterointegrated with GaN and a method for fabricating the same is disclosed. The method uses a (100) silicon substrate to fabricate a hundred nanometer scale hole and uses wet etching to etch the silicon substrate, thereby exposing the (111) crystal surface of the silicon substrate. The (111) crystal surface is used as a nucleating crystal surface of an AlN buffer layer and GaN. When GaN is grown, silane is reacted with GaN to adjust the concentration of doping silicon atoms into GaN, thereby forming a semiconductor structure having a Si substrate heterointegrated with GaN.

8 Claims, 10 Drawing Sheets

(52) U.S. Cl.
CPC .. *H01L 21/02433* (2013.01); *H01L 21/02458*
(2013.01); *H01L 29/2003* (2013.01)

(56) References Cited

U.S. PATENT DOCUMENTS

| | | | |
|---|---|---|---|
| 2010/0072515 A1* | 3/2010 | Park | H01L 21/02658 257/190 |
| 2016/0020283 A1 | 1/2016 | Bayram et al. | |
| 2017/0207307 A1 | 7/2017 | Dasgupta et al. | |

FOREIGN PATENT DOCUMENTS

| | | |
|---|---|---|
| CN | 105874587 A | 8/2016 |
| CN | 106549038 A | 3/2017 |
| CN | 108987473 A | 12/2018 |
| JP | H07254561 A | 10/1995 |
| JP | 2002110569 A | 4/2002 |
| JP | 2003243702 A | 8/2003 |
| JP | 2009508322 A | 2/2009 |
| JP | 2010118616 A | 5/2010 |
| JP | 2012031047 A | 2/2012 |
| JP | 2018520977 A | 8/2018 |
| JP | 2019507716 A | 3/2019 |
| TW | 550633 B | 9/2003 |
| TW | 201542892 A | 11/2015 |
| TW | 201904087 A | 1/2019 |
| WO | 2018031876 A1 | 2/2018 |

OTHER PUBLICATIONS

Chen, et al. "Growth and Fabrication of Semi-Polar InGaN/GaN Multi-Quantum Well Light-Emitting Diodes on Microstructured Si (001) Substrates." Chinese Physics B, vol. 24, No. 11 (Oct. 2015), p. 118102. doi: 10.1088/1674-1056/24/11/118102.

Reuters, et al. "Selective MOVPE of InGaN-Based LED Structures on Non-Planar Si (111) Facets of Patterned Si (100) Substrates." J Crystal Growth, vol. 391 (Apr. 2014). pp. 33-40. doi: 10.1016/j.jcrysgro.2014.01.002.

* cited by examiner

SEMICONDUCTOR STRUCTURE HAVING A SI SUBSTRATE HETEROINTEGRATED WITH GAN AND METHOD FOR FABRICATING THE SAME

This application claims priority for U.S. patent Ser. No. 16/519,418 filed on 23 Jul. 2020 and Taiwan patent application no. 108117447 filed on May 21, 2019, the content of which is incorporated by reference in its entirely.

BACKGROUND OF THE INVENTION

Field of the Invention

The present invention relates to the technology for epitaxially growing GaN, particularly to a semiconductor structure having a Si substrate heterointegrated with GaN and a method for fabricating the same.

Description of the Related Art

The III-V compound semiconductor-GaN materials feature many excellent physical properties, such as high breakdown voltage, wide energy gap, high electron drift speed, etc., and suit for high current and high withstanding voltage electronic components. In the conventional technology, the methods for fabricating gallium nitride on sapphire or silicon carbide substrates have been well known, but the cost of using these substrates to grow gallium nitride is relatively expensive. If the silicon substrate is used to form a gallium nitride epitaxial layer, the manufacturing cost can be reduced, the driving voltage of the device can be reduced, the heat dissipating efficiency can be improved, and the power characteristics of the device can be improved.

In recent years, the technology of heterointegrating GaN with a silicon substrate has unlimited potential for future development, which will greatly enhance the competitiveness and application range of GaN devices. However, the epitaxial technology for silicon substrate has a bottleneck to be broken through. When a GaN epitaxial layer is formed on a silicon substrate, the GaN layer and the silicon layer easily have a great number of lattice defects to deteriorate the characteristics of GaN—Si semiconductor devices since the difference in lattice constant and thermal expansion coefficient between the gallium nitride and the silicon substrate is too large.

To overcome the abovementioned problems, the present invention provides a semiconductor structure having a Si substrate heterointegrated with GaN and a method for fabricating the same to improve the epitaxial quality of GaN and the expansibility of GaN—Si semiconductor technology.

SUMMARY OF THE INVENTION

The primary objective of the present invention is to provide a semiconductor structure having a Si substrate heterointegrated with GaN and a method for fabricating the same, which form a GaN epitaxial layer on a silicon substrate having a (111) crystal surface using selective area growth (SEG) to reduce dislocation defects of the GaN epitaxial layer and effectively improve the epitaxial quality of growing GaN on the silicon substrate. When GaN is grown, Si atoms are doped into GaN to heterointegrate GaN with Si processes, thereby applying to Si-MOSFET devices and solving the breakdown problems with continuing scaling down devices.

To achieve the abovementioned objectives, the present invention provides a semiconductor structure having a Si substrate heterointegrated with GaN, which comprises: a silicon substrate having a main surface, which has a (100) crystal surface, the main surface is provided with an oxide layer thereon, the oxide layer and the silicon substrate are partially removed to have a hundred nanometer scale hole, a wall of the hundred nanometer scale hole is formed of a sidewall and a tilted surface downward extended from the sidewall, the sidewall is provided with a nitride layer thereon, and the tilted surface has a (111) crystal surface of the silicon substrate; an AlN buffer layer formed on the tilted surface of the hundred nanometer scale hole; and a silicon-doped GaN epitaxial layer formed in the hundred nanometer scale hole and formed on the AlN buffer layer.

The present invention provides a method for fabricating a semiconductor structure having a Si substrate heterointegrated with GaN comprising: providing a silicon substrate having a main surface, which has a (100) crystal surface and growing an oxide layer on the main surface; patterning the oxide layer to serve as a hard mask and using reactive-ion etching (RIE) to etch the silicon substrate, thereby forming a hundred nanometer scale hole; using plasma enhanced chemical vapor deposition (PECVD) to grow a nitride layer in the hundred nanometer scale hole and using inductively coupled plasma (ICP) to remove the nitride layer on a bottom wall of the hundred nanometer scale hole, thereby exposing a (100) crystal surface of the silicon substrate and leaving the nitride layer on a sidewall of the hundred nanometer scale hole; using the nitride layer on the sidewall as a blocking layer and using wet etching to etch the silicon substrate exposed from the bottom wall of the hundred nanometer scale hole until exposing a tilted surface which has a (111) crystal surface; and using metal organic chemical-vapor deposition (MOCVD) to sequentially grow an AlN buffer layer and a GaN epitaxial layer in the hundred nanometer scale hole and doping silicon into the GaN epitaxial layer to forma silicon-doped GaN epitaxial layer.

Compared with the conventional technology for growing an epitaxial layer on the whole surface of a substrate, the semiconductor structure having a Si substrate heterointegrated with GaN and the method for fabricating the same of the present invention use selective area growth (SEG) to achieve higher crystallinity. This is because the dislocation will ends at the sidewall to effectively control the size and the shape of the GaN epitaxial layer when GaN is grown in the hundred nanometer scale hole using SEG Besides, the present invention uses wet etching to form the (111) crystal surface of the silicon substrate, wherein the (111) crystal surface provides a preferred nucleating crystal surface of the AlN buffer layer and the GaN epitaxial layer. Thus, hexagonal crystal GaN materials are grown on the (111) crystal surface and then combined with each other to form cubic crystal GaN. In addition, when GaN is grown, silicon atoms are doped into GaN. The concentration of doping the silicon atoms into GaN is adjusted to form an ideal GaN—Si semiconductor structure, thereby controlling the vertical leakage current.

Below, the embodiments are described in detail in cooperation with the drawings to make easily understood the technical contents, characteristics and accomplishments of the present invention.

DETAILED DESCRIPTION OF THE INVENTION

The present invention provides a semiconductor structure having a Si substrate heterointegrated with GaN and a method for fabricating the same, which are suitable for the technology for high-frequency and high-power GaN/Si heterojunction transistors.

Figure 1A:
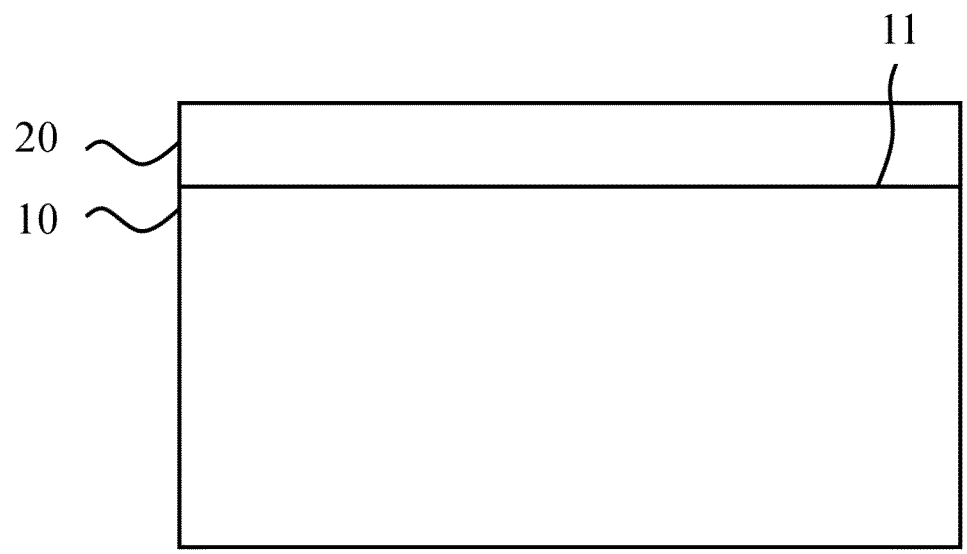
FIGS. 1A-1F are diagrams schematically illustrating the steps of method for fabricating a semiconductor structure having a Si substrate heterointegrated with GaN according to an embodiment of the present invention.

Refer to FIGS. 1A-1F. FIGS. 1A-1F are diagrams schematically illustrating the steps of method for fabricating a semiconductor structure having a Si substrate heterointegrated with GaN according to an embodiment of the present invention. The method comprises the following steps:

Firstly, as shown in FIG. 1A, a silicon substrate 10 is provided. The silicon substrate 10 has a main surface 11, which has a (100) crystal surface. In an oxidation-diffusion system, an oxide layer 20 having a given thickness is grown on the main surface 11 of the silicon substrate 10 using thermal oxidation. Specifically, the oxide layer 20 comprises $SiO_2$ and has a thickness of 100 nm.

Figure 1B:
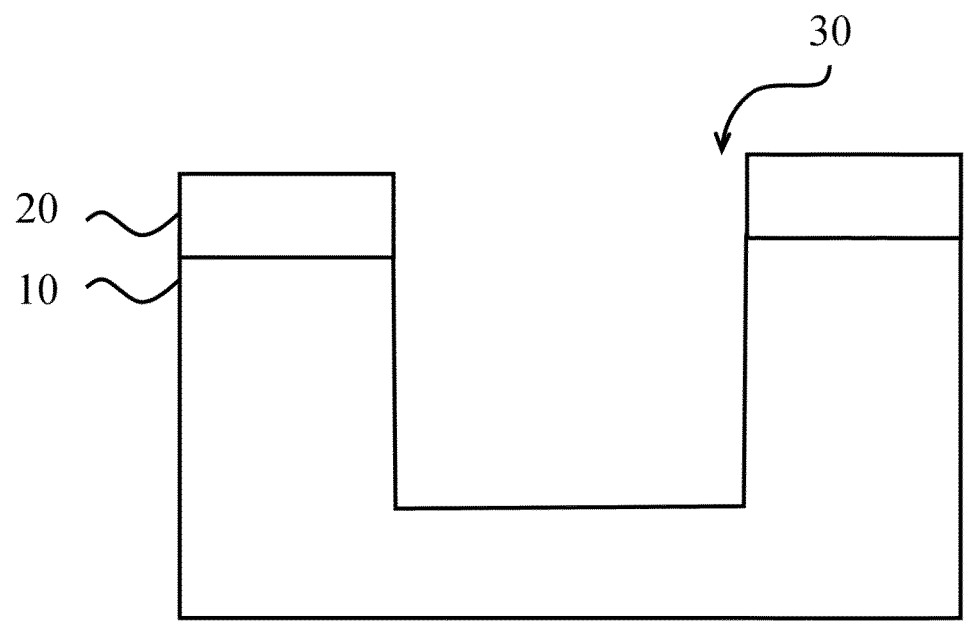

As shown in FIG. 1B, a nanometer scale hole is patterned. The oxide layer 20 is patterned to serve it as a hard mask using electron beam lithography. The silicon substrate 10 is partially removed to form a hundred nanometer scale hole 30 using reactive-ion etching (RIE).

In an embodiment of the present invention, the hundred nanometer scale hole 30 penetrates through the oxide layer 20 having a thickness of 100 nm and extends to within the silicon substrate 10. In the step, the hundred nanometer scale hole 30 has a depth of 250 nm within the silicon substrate 10. In practice, the hundred nanometer scale hole 30 has a depth of 250-700 nm within the silicon substrate 10.

Figure 1C:
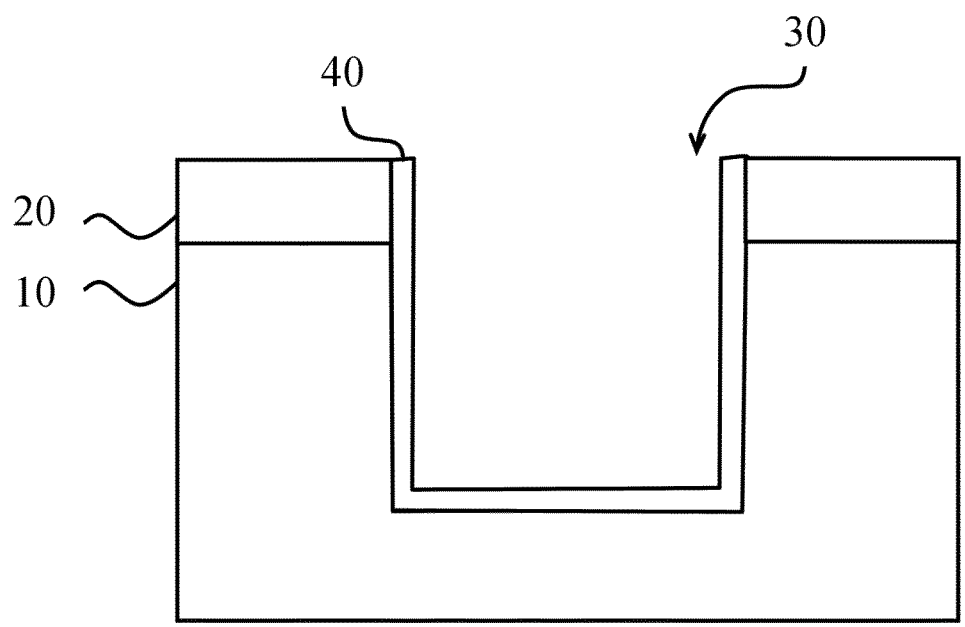

As shown in FIG. 1C, a nitride layer 40 having a given thickness is grown on the wall of the hundred nanometer scale hole 30 using plasma enhanced chemical vapor deposition (PECVD). Specifically, the nitride layer 40 comprises SiNx and has a thickness of 200 nm.

Figure 1D:
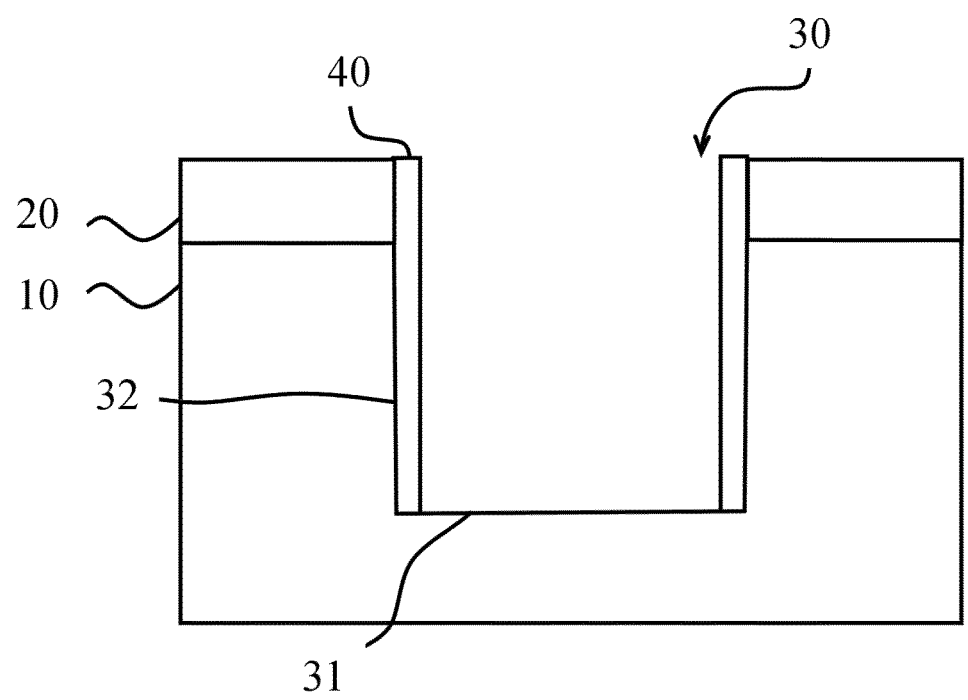

Then, as shown in FIG. 1D, the nitride layer 40 on the bottom wall 31 of the hundred nanometer scale hole 30 is removed using inductively coupled plasma (ICP), thereby exposing the (100) crystal surface of the silicon substrate 10 and leaving the nitride layer 40 on the sidewall 32 of the hundred nanometer scale hole 30.

Figure 1E:
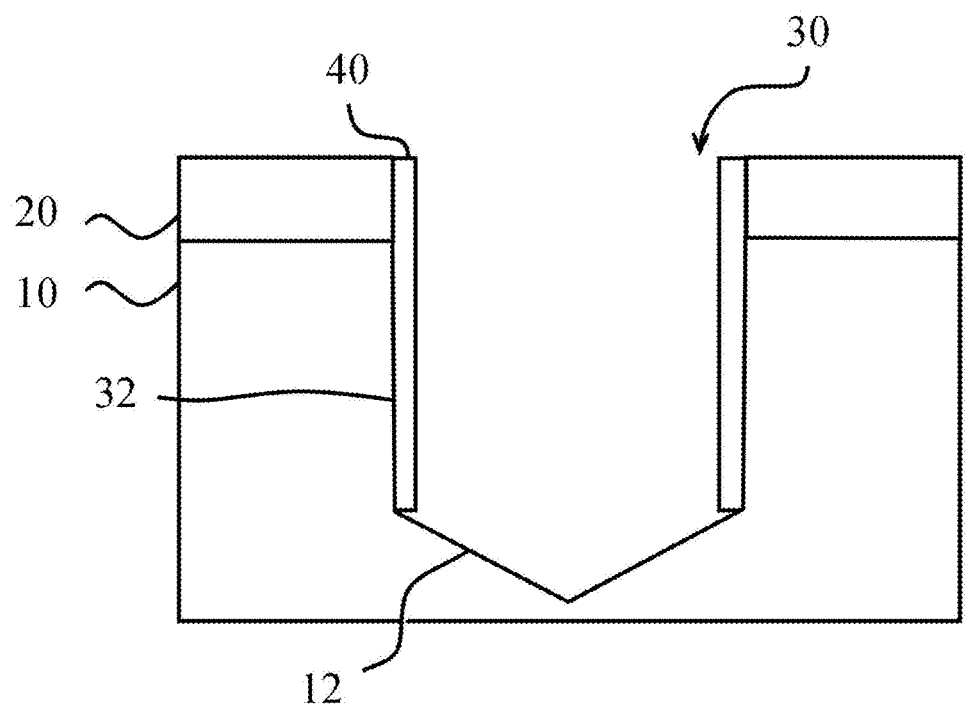

Then, as shown in FIG. 1E, the nitride layer 40 on the sidewall 32 is used as a blocking layer and potassium hydroxide (KOH) is used as an etching solution. The etching solution is heated to 80° C. for 110 seconds. The (100) crystal surface of the silicon substrate 10 exposed from the bottom wall 31 of the hundred nanometer scale hole 30 is etched at 80° C. using wet etching until a tilted surface which has the (111) crystal surface of the silicon substrate 30 is exposed, wherein the wet etching uses the KOH as the etching solution.

In the step, the bottom wall 31 of the hundred nanometer scale hole 30 in FIG. 1B is downward etched to have a V-like groove. Except for the V-like groove, the sidewall 32 of the hundred nanometer scale hole 30 has a depth of 200-300 nm within the silicon substrate 10.

Figure 1F:
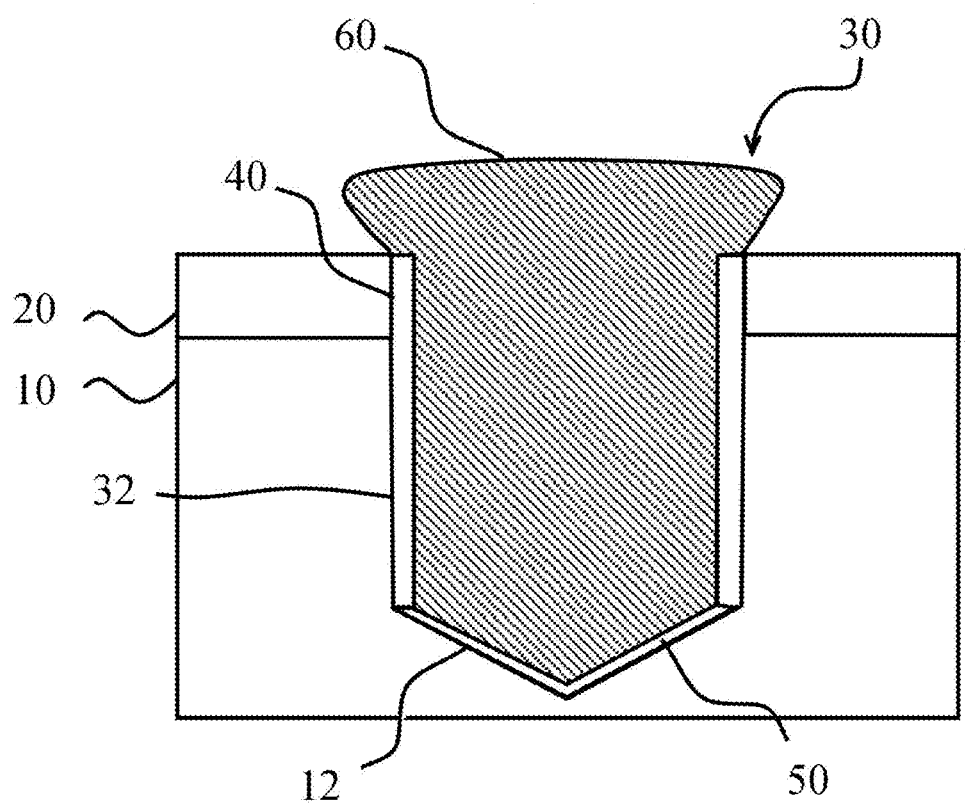

As shown in FIG. 1F, an AlN buffer layer 50 and a GaN epitaxial layer 60 are sequentially grown in the hundred nanometer scale hole 30 using metal organic chemical-vapor deposition (MOCVD) and silicon is doped. Specifically, when the GaN epitaxial layer 60 is grown, the doping gas of slime and hydrogen is reacted with the GaN epitaxial layer 60 to increase and control the concentration of doping silicon atoms into the GaN epitaxial layer 60, thereby forming an ideal silicon-doped GaN epitaxial layer 60.

In the semiconductor structure having a Si substrate heterointegrated with GaN according to an embodiment of the present invention, the oxide layer 20 is formed on the main surface 11 of the silicon substrate 10 which has the (100) crystal surface. The oxide layer 20 and the silicon substrate 10 are partially removed to form the hundred nanometer scale hole 30. The wall of the hundred nanometer scale hole 30 is formed of a sidewall 32 and a tilted surface 12 downward extended from the sidewall 32 and connected with the sidewall 32. The sidewall 32 is covered with the nitride layer 40. The tilted surface 12 has the (111) crystal surface of the silicon substrate 10. The AlN buffer layer 50 is formed on the tilted surface 12 of the hundred nanometer scale hole 30. The silicon-doped GaN epitaxial layer 60 is formed in the hundred nanometer scale hole 30 and formed on the AlN buffer layer 50.

In an embodiment of the present invention, the sidewall 32 of the hundred nanometer scale hole 30 is roughly perpendicular to the main surface 11 of the silicon substrate 10, which has the (100) crystal surface. The tilted surface 12 connected with the bottom of the sidewall 32 forms a V-like groove. The oxide layer 20 has a thickness of about 100 nm. Except for the V-like groove, the sidewall 32 of the hundred nanometer scale hole 30 has a depth of about 200-300 nm within the silicon substrate 10. Thus, except for the V-like groove, the sidewall 32 of the hundred nanometer scale hole 30 has a total depth of about 300-400 nm.

Figure 2:
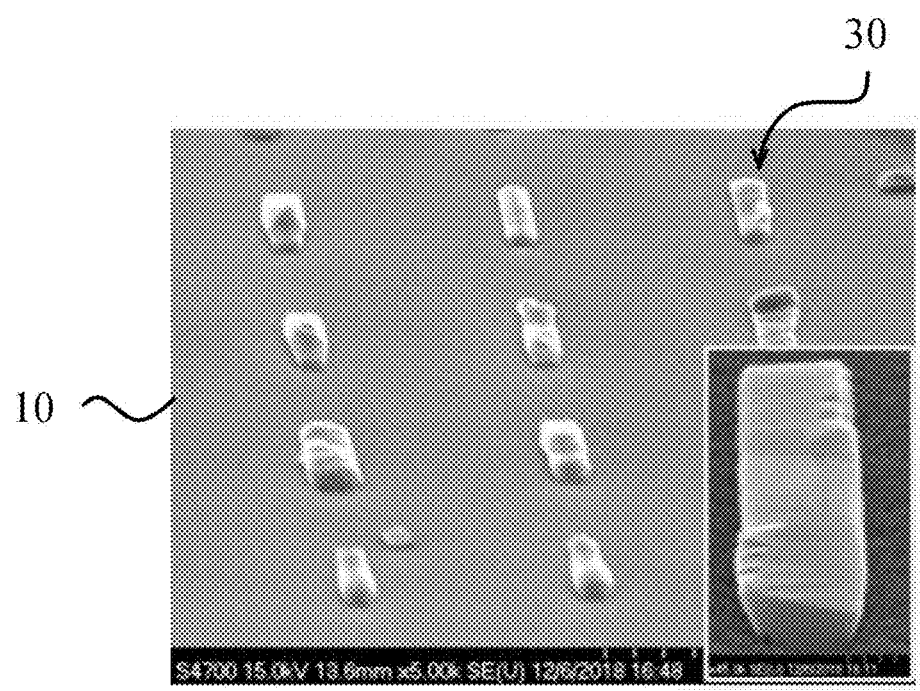
FIG. 2 is a scanning electron microscope (SEM) image illustrating a semiconductor structure according to an embodiment of the present invention.

Refer to FIG. 2. FIG. 2 is a scanning electron microscope (SEM) image illustrating a semiconductor structure according to an embodiment of the present invention. In the embodiment, the silicon substrate 10 has a plurality of hundred nanometer scale holes 30. Each of the hundred nanometer scale holes 30 of the silicon substrate 10 has a shape of a rectangle, wherein the rectangle has a width of 500 nm and a length of 5 μm.

Figure 3A:
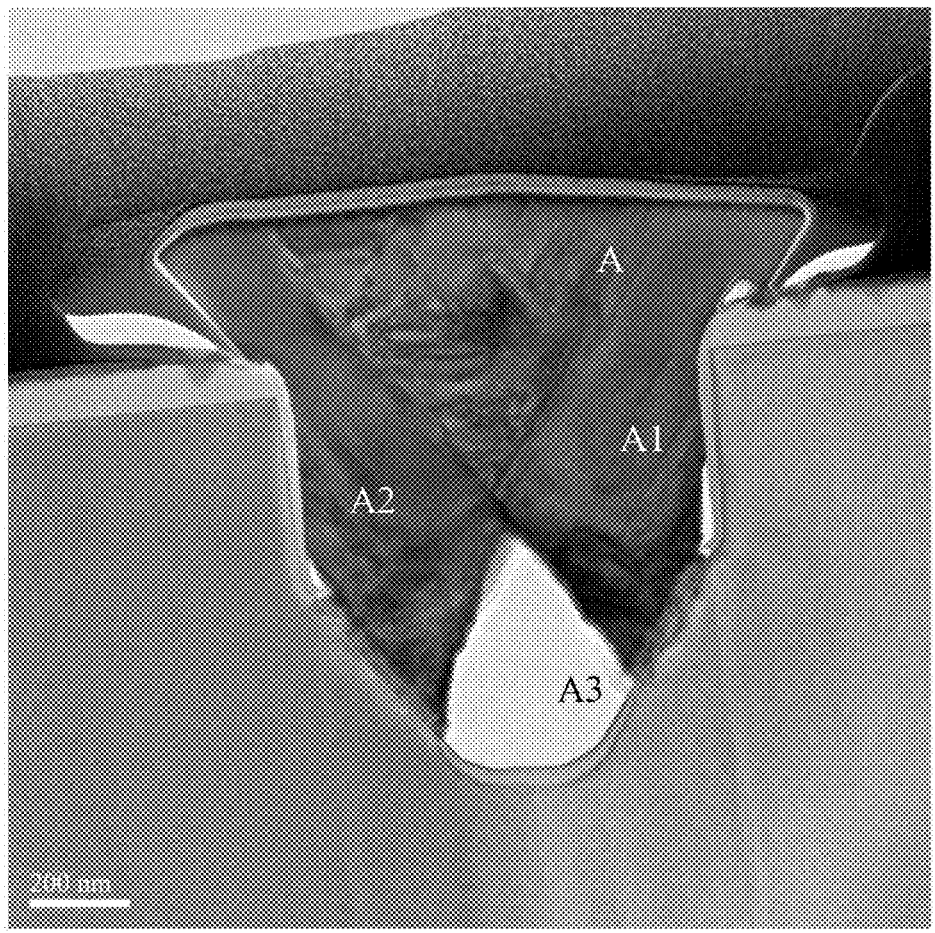
FIG. 3A and FIG. 3B are transmission electron microscope (TEM) images respectively illustrating a semiconductor structure and an enlarged part of the semiconductor structure according to an embodiment of the present invention.
Figure 3B:
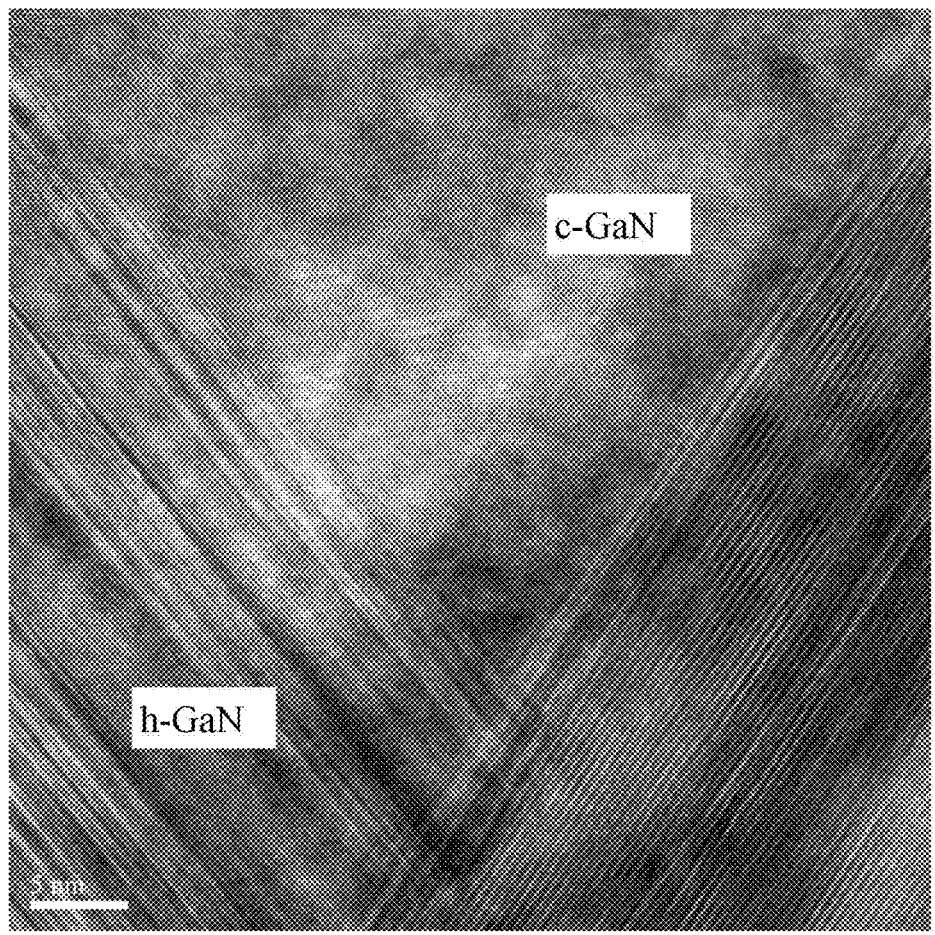

FIG. 3A and FIG. 3B are transmission electron microscope (TEM) images respectively illustrating a semiconductor structure and an enlarged part of the semiconductor structure according to an embodiment of the present invention. In an embodiment of the present invention, the (100) silicon substrate is etched using wet etching to form the (111) crystal surface, which provides a preferred nucleating crystal surface of the AlN buffer layer and the GaN epitaxial layer. The hexagonal crystal GaN materials grown on the sidewall are combined with each other to form cubic crystal GaN. As shown in FIG. 3A, the central bottom of the hundred nanometer scale hole has a highly crystallographic defect region A3, and highly crystallized regions A1, A2, and A are formed from the sidewall to the surface of the silicon substrate. Refer to FIG. 3B which is a diagram illustrating an enlarged part of the highly crystallized region A of FIG. 3A. According to electron diffraction, hexagonal crystal GaN (h-GaN) materials being single crystal are grown on the (111) crystal surface and then combined with each other to form cubic crystal GaN (c-GaN) at the central region of the hundred nanometer scale hole.

Figure 4A:
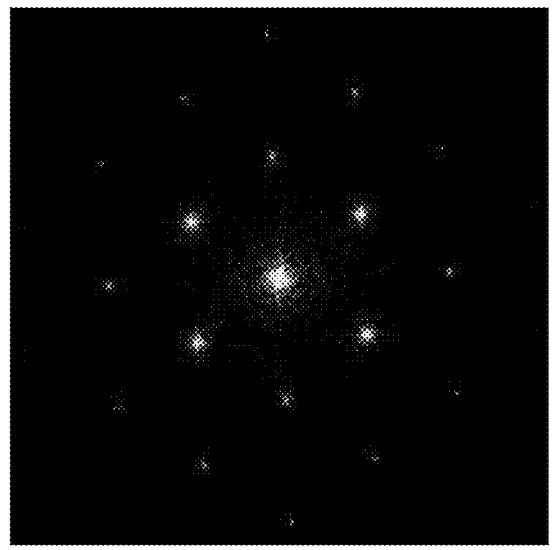
FIG. 4A and FIG. 4B are diagrams illustrating electron diffraction of hexagonal crystal GaN (h-GaN) and cubic crystal GaN (c-GaN) according to an embodiment of the present invention.
Figure 4B:
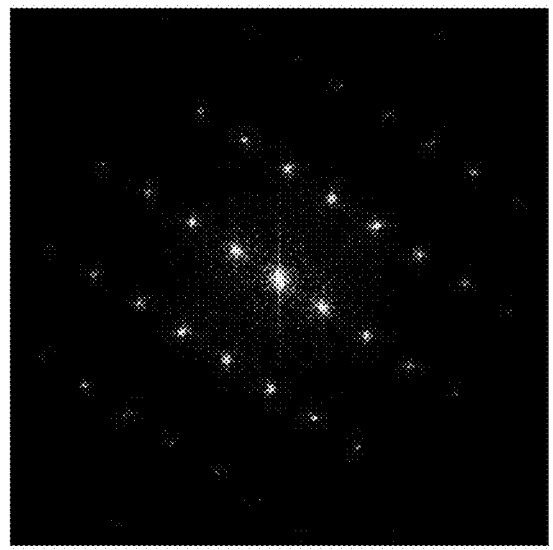

Refer to FIG. 4A and FIG. 4B. FIG. 4A and FIG. 4B are diagrams illustrating electron diffraction of hexagonal crystal GaN (h-GaN) and cubic crystal GaN (c-GaN) according to an embodiment of the present invention.

Figure 5A:
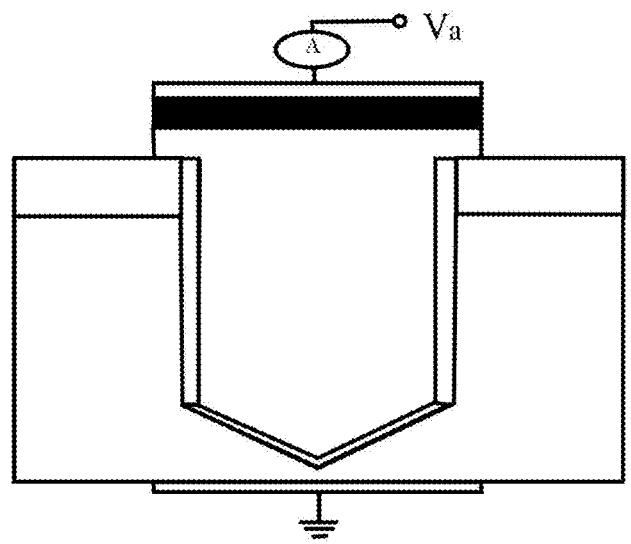
FIGS. 5A-5C are diagrams schematically illustrating silicon-doped GaN epitaxial layers having different silicon-doped concentrations according to an embodiment of the present invention.
Figure 5B:
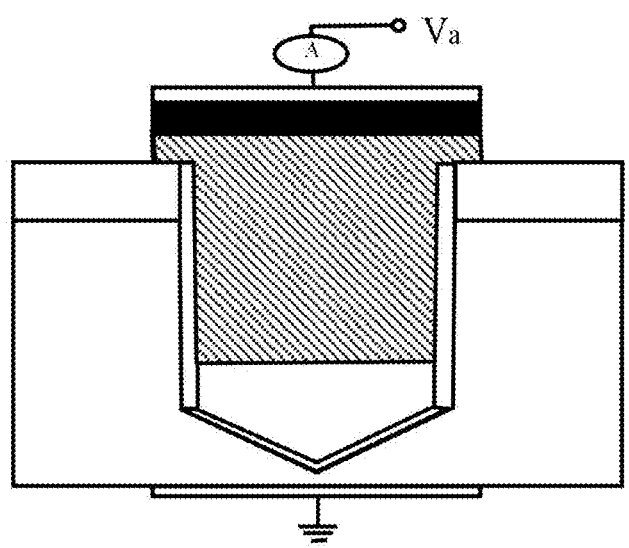
Figure 5C:
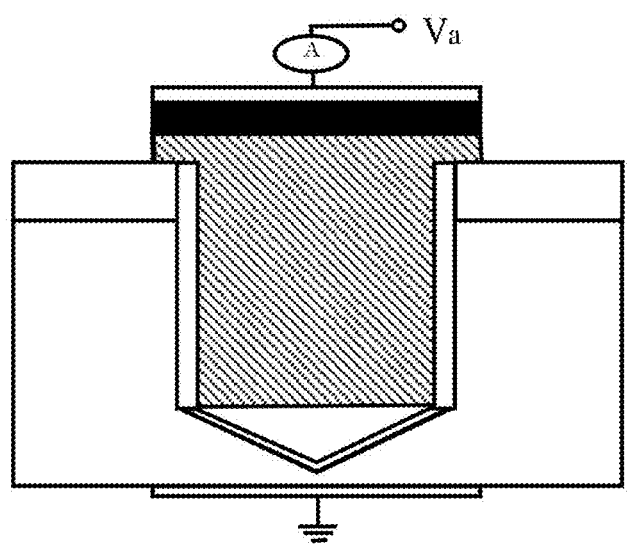
Figure 6:
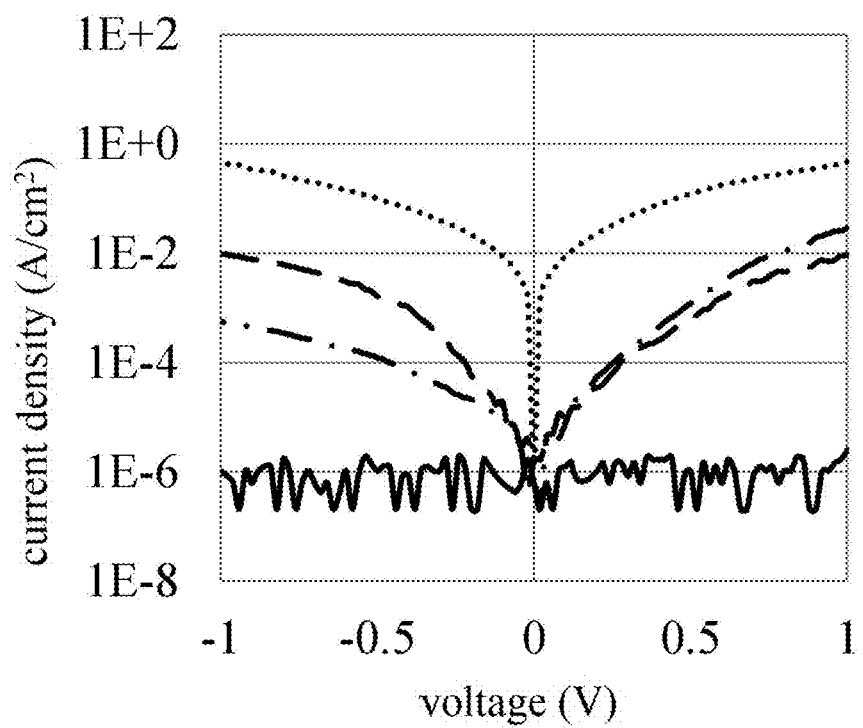
FIG. 6 is a diagram schematically illustrating results of measuring the leakage current of silicon-doped GaN epitaxial layers having different silicon-doped concentrations according to an embodiment of the present invention.

Refer to FIGS. 5A-5C. FIGS. 5A-5C are diagrams schematically illustrating silicon-doped GaN epitaxial layers having different silicon-doped concentrations according to an embodiment of the present invention. A black region represents a highly-doped region, an oblique-line region represents lowly-doped region, and a white region represents an undoped region. Specifically, FIG. 5A shows a highly-doped region having a thickness of 100 nm and an undoped region having a thickness of 1000 nm. FIG. 5B shows a highly-doped region having a thickness of 100 nm, a lowly-doped region having a thickness of 500 nm, and an undoped region having a thickness of 500 nm. FIG. 5C shows a highly-doped region having a thickness of 100 nm, a lowly-doped region having a thickness of 750 nm, and an undoped region having a thickness of 250 nm. Refer to FIG. 6. FIG. 6 is a diagram schematically illustrating results of measuring the leakage current of silicon-doped GaN epitaxial layers having different silicon-doped concentrations according to an embodiment of the present invention. The three curves from top to bottom in FIG. 6 respectively represent the results of measuring the leakage current of silicon-doped GaN epitaxial layers respectively corresponding to FIG. 5A, FIG. 5B, and FIG. 5C.

The measured results show that the high energy-gap material being GaN and the doped Si achieve low leakage current, thereby forming an ideal GaN drain, which is applied to Si-MOSFETs to solve the breakdown problem with continuing scaling down devices.

In conclusion, the semiconductor structure having a Si substrate heterointegrated with GaN and the method for fabricating the same of the present invention use metal organic chemical-vapor deposition (MOCVD) and selective area growth (SEG) to form the GaN epitaxial layer in the hundred nanometer scale hole of the (100) silicon substrate. The hundred nanometer scale hole exposes the (111) crystal surface of the silicon substrate to serve as the nucleating surface. The lattice dislocation of the GaN epitaxial layer during a crystallization process will end at the sidewall of the hundred nanometer scale hole. The hexagonal crystal GaN materials are grown on the sidewall and then combined with each other to form cubic crystal GaN with high crystallinity at the central region of the hundred nanometer scale hole. The SEG technique can effectively control and design the size and the shape of the GaN epitaxial layer.

In addition, the present invention uses SEG to grow the GaN epitaxial layer and dopes Si atoms into the GaN epitaxial layer, and adjusts the ratio of doping Si atoms to control the vertical leakage current, thereby forming an ideal GaN drain. The wide-bandgap GaN drain is heterointegrated with Si-MOSFETs to improve the threshold voltage of the semiconductor structure, whereby the semiconductor structure features high current and high transconductance to reduce the power consumption of devices on standby, thereby applying to digital logic circuits and satisfying the requirement for applications of GaN devices in the future.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating a semiconductor structure having a Si substrate heterointegrated with GaN comprising:
   providing a silicon substrate having a main surface, which has a (100) crystal surface and growing an oxide layer on the main surface;
   patterning the oxide layer to serve as a hard mask and using reactive-ion etching (RIE) to etch the silicon substrate, thereby forming a hundred nanometer scale hole;
   using plasma enhanced chemical vapor deposition (PECVD) to grow a nitride layer in the hundred nanometer scale hole and using inductively coupled plasma (ICP) to remove the nitride layer on a bottom wall of the hundred nanometer scale hole, thereby exposing a (100) crystal surface of the silicon substrate and leaving the nitride layer on a sidewall of the hundred nanometer scale hole;
   using the nitride layer on the sidewall as a blocking layer and using wet etching to etch the silicon substrate exposed from the bottom wall of the hundred nanometer scale hole until exposing a tilted surface which has a (111) crystal surface; and
   using metal organic chemical-vapor deposition (MOCVD) to sequentially grow an AlN buffer layer and a GaN epitaxial layer in the hundred nanometer scale hole and doping silicon into the GaN epitaxial layer to form a silicon-doped GaN epitaxial layer.

2. The method for fabricating the semiconductor structure having the Si substrate heterointegrated with GaN according to claim 1, wherein the oxide layer is grown on the silicon substrate using thermal oxidation.

3. The method for fabricating the semiconductor structure having the Si substrate heterointegrated with GaN according to claim 1, wherein the oxide layer has a thickness of 100 nm.

4. The method for fabricating the semiconductor structure having the Si substrate heterointegrated with GaN according to claim 1, wherein the sidewall of the hundred nanometer scale hole has a depth of 250-700 nm within the silicon substrate.

5. The method for fabricating the semiconductor structure having the Si substrate heterointegrated with GaN according to claim 1, wherein the sidewall is perpendicular to the (100) crystal surface.

6. The method for fabricating the semiconductor structure having the Si substrate heterointegrated with GaN according to claim 1, wherein the wet etching uses potassium hydroxide as an etching solution and etches the silicon substrate at 80° C.

7. The method for fabricating the semiconductor structure having the Si substrate heterointegrated with GaN according to claim 1, wherein the silicon-doped GaN epitaxial layer comprises cubic crystal GaN.

8. The method for fabricating the semiconductor structure having the Si substrate heterointegrated with GaN according to claim 1, wherein in the step of doping the silicon into the GaN epitaxial layer, doping gas of silane is reacted with the GaN epitaxial layer to increase and control a concentration of doping silicon atoms into the GaN epitaxial layer when the GaN epitaxial layer is grown.

\* \* \* \* \*